United States Patent [19]

Bläsing et al.

[11] Patent Number: 4,560,460
[45] Date of Patent: Dec. 24, 1985

[54] APPARATUS FOR THE GALVANIC DEPOSITION OF METAL

[75] Inventors: Horst Bläsing; Manfred Kallweit, both of Berlin, Fed. Rep. of Germany

[73] Assignee: Schering Aktiengesellschaft, Berlin and Bergkamen, Fed. Rep. of Germany

[21] Appl. No.: 609,558

[22] Filed: May 11, 1984

[30] Foreign Application Priority Data

May 13, 1983 [DE] Fed. Rep. of Germany ....... 3317970

[51] Int. Cl.⁴ ...................... C25D 17/02; C25D 17/28
[52] U.S. Cl. ................................. 204/224 R; 204/275
[58] Field of Search ...................... 204/224 R, 15, 275, 204/DIG. 7, 47.5, 49, 273, 129.7

[56] References Cited

U.S. PATENT DOCUMENTS

| | | | |
|---|---|---|---|
| 2,698,832 | 1/1955 | Swanson | 204/224 R |
| 2,828,255 | 3/1958 | Gempe | 204/DIG. 7 |
| 4,183,799 | 1/1980 | Sellitto et al. | 204/DIG. 7 |
| 4,340,449 | 7/1982 | Srinivasan et al. | 204/15 |
| 4,364,801 | 12/1982 | Salama | 204/15 |
| 4,405,410 | 9/1983 | Sebastien | 204/15 |

FOREIGN PATENT DOCUMENTS 850972 9/1952 Fed. Rep. of Germany ... 204/DIG. 7

*Primary Examiner*—Donald R. Valentine
*Attorney, Agent, or Firm*—Michael J. Striker

[57] ABSTRACT

An arrangement is disclosed for the galvanic deposition of metal at relatively greater speed and with controllable layer-thickness distribution, of the type composed of an electrolysis tank with overflow, electrodes, nozzles, connecting conduit tubes, pumps, control system means and dosaging system means as well as electrical appurtenances, wherein a cathodically-connected work piece to be galvanized is arranged between two nozzles which are each formed from two chambers located one above the other and having separate entrance and exitways, the upper chamber contains an electrolyte exit opening provided as a longitudinal slit and the lower chamber defines an anode niche displaying at the height of the slit a vertically-adjustable opening. Also disclosed is a method for the electrolytical deposition of metal, employing substantially the abovedescribed arrangement and particularly for depositing nickel- or gold-coatings on plug contacts of printed circuits.

11 Claims, 6 Drawing Figures

APPARATUS FOR THE GALVANIC DEPOSITION OF METAL

BACKGROUND OF THE INVENTION

The invention concerns an arrangement for the galvanic deposition of metals at superb velocity and with controllable layer-thickness distribution.

In general, such arrangements include an electrolysis unit with overflow, electrodes, nozzles, connecting conduits, pumps, control systems and dosaging systems, as well as electrical appurtenances.

Also a part of the present invention is a method for the continuous galvanization of metal surfaces by way of employment of the same such apparatus.

Work pieces or so-called substrates, i.e., particularly the contacts of conductor plates, are galvanically metallized as a rule in throughput plants using conventional baths.

The metallization follows, for the most part, partially, in that plating liquid is led against the work pieces respectively plates provided in a series by way of a transportation arrangements.

As a result of the throughput times involved therewith, working up must be performed with strong flowing and of sufficient electrolyte supply, which leads in the main to unsatisfactory layer-thickness distributions.

As set forth in German D.E.-0.S. No. 2928904, an arrangement is already known for the plating of output leads of a printed conductor plate, whereby the plating liquid is led from the reservoir through bore holes behind which are applied a foil, even a crimped or bent foil; indeed according to the radius of which is the required concentration of liquid elevated or decreased. There is generally, no assurance that the layer-thickness distribution can be precisely controlled. Moreover, the obtained layer-thicknesses do not always correspond to the specifications required.

SUMMARY OF THE INVENTION

It is, therefore, an object of the present invention to provide an arrangement of the abovedescribed type, which guarantees a galvanic deposition of metals at superior velocity and with controllable layer-thickness distribution.

This object is obtained according to the present invention, by means of an arrangement of the general type, having an electrolyte tank with overflow means, electrodes, nozzles, connecting conduits, pumps, control system means and dosaging system means as well as electrical appurtenances, which is thereby characterized by providing to arrange the work piece that is to be subjected to the electrolysis-type cathodic layering between two nozzles, the said same being always formed of two superposed chambers and having separate introduction and exit connection means, the uppermost of said two containing an electrolyte exit opening provided preferably as a longitudinal slit, while the lower said chamber is being provided with an anode niche, which displays a vertically adjustable opening at the height of the slit.

The novel features which are considered characteristic for the invention are set forth in particular in the appended claims. The invention itself, however, both as to its construction and its method of operation, together with additional objects and advantages thereof, will be best understood from the following description of specific embodiments when read in connection with the accompanying drawing.

DESCRIPTION OF THE PREFERRED EMBODIMENTS

Figure 1A:
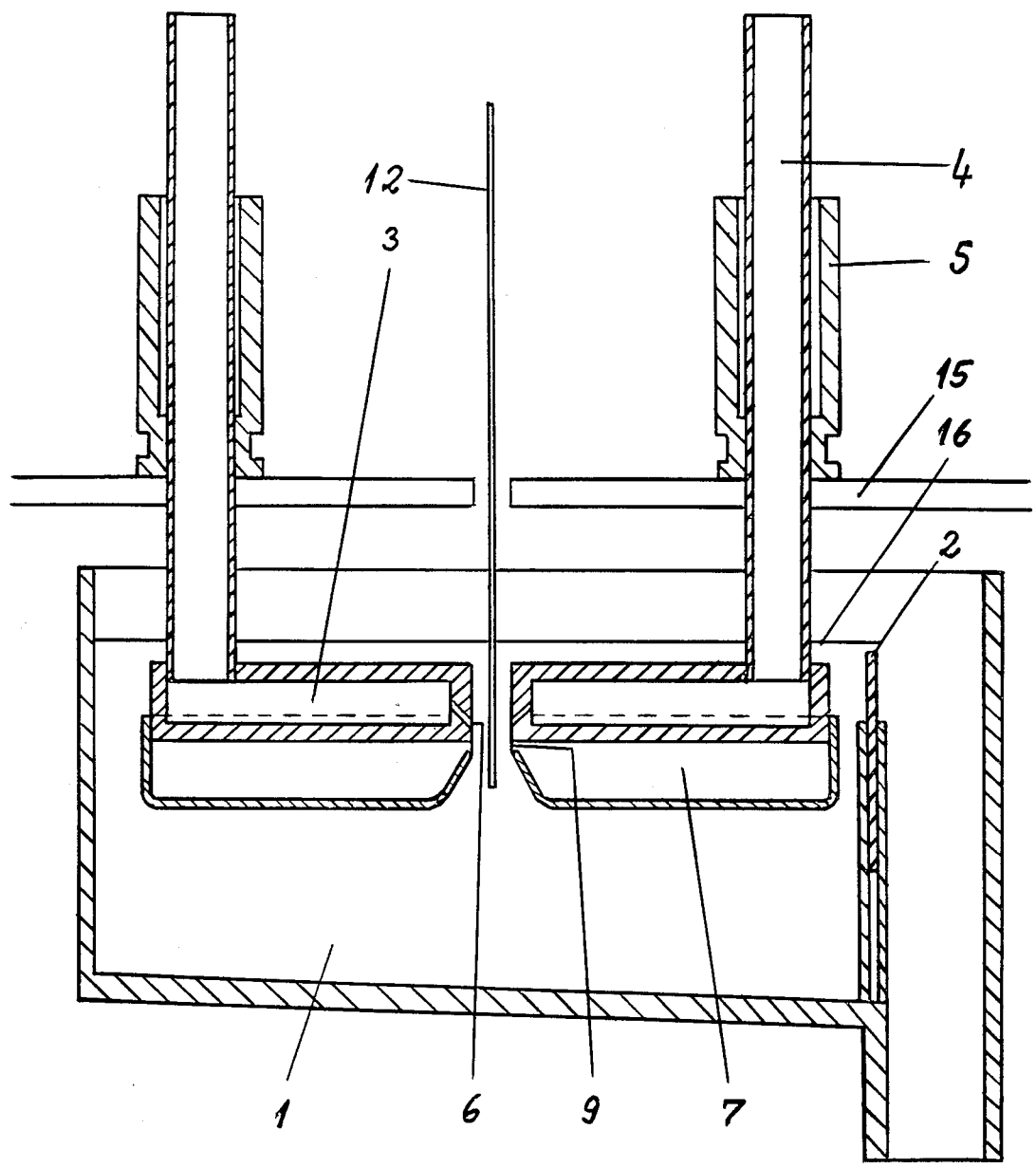
FIG. 1a shows in side view the arrangment according to the present invention having the pair of nozzles in the electrolyte tank defining a section through the lower elctrolyte introduction means.
Figure 1B:
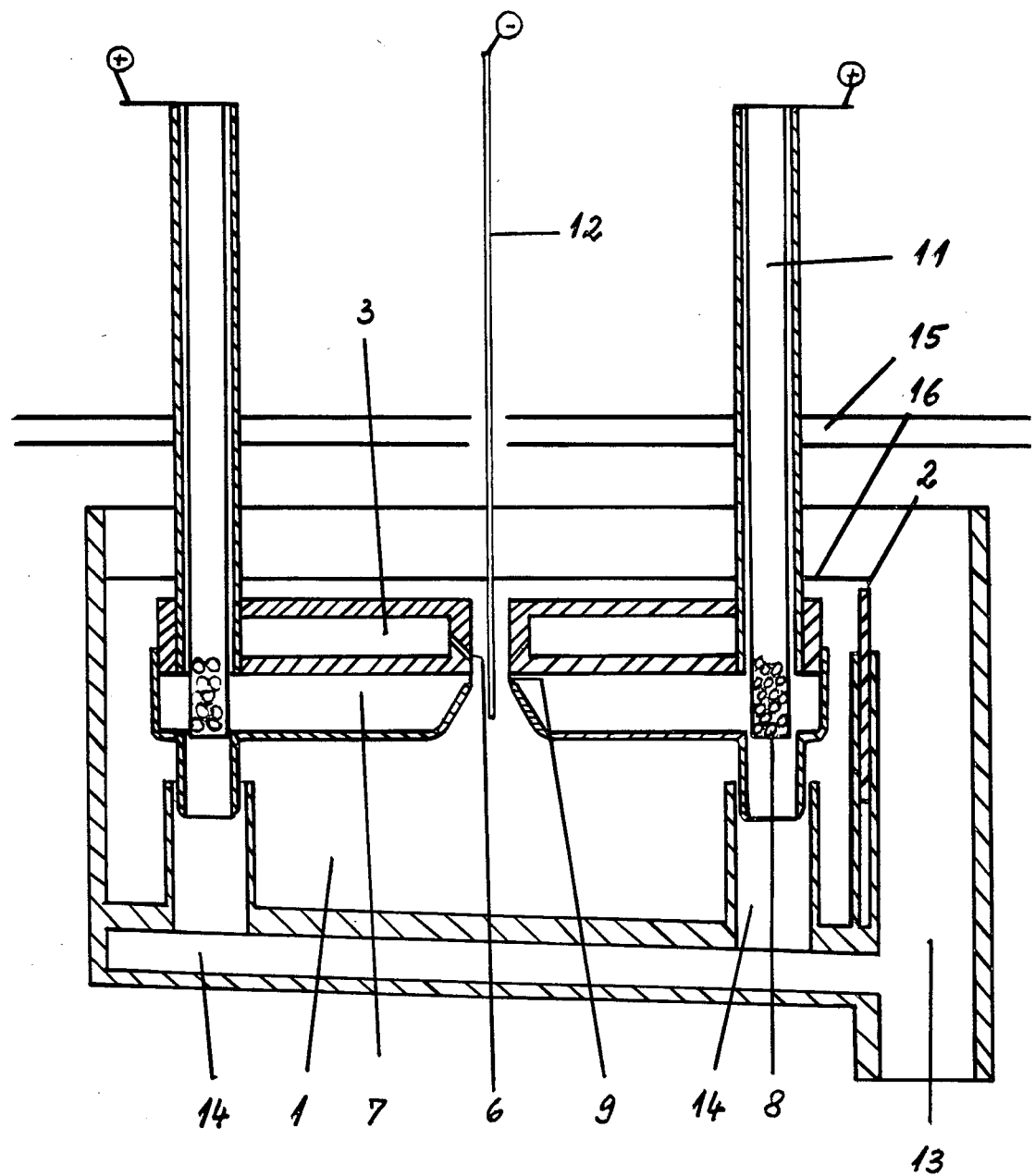
FIG. 1b shows the side view, otherwise similar as with FIG. 1a; however, the pair of nozzles in a sectional plane through the anode niche.
Figure 1C:
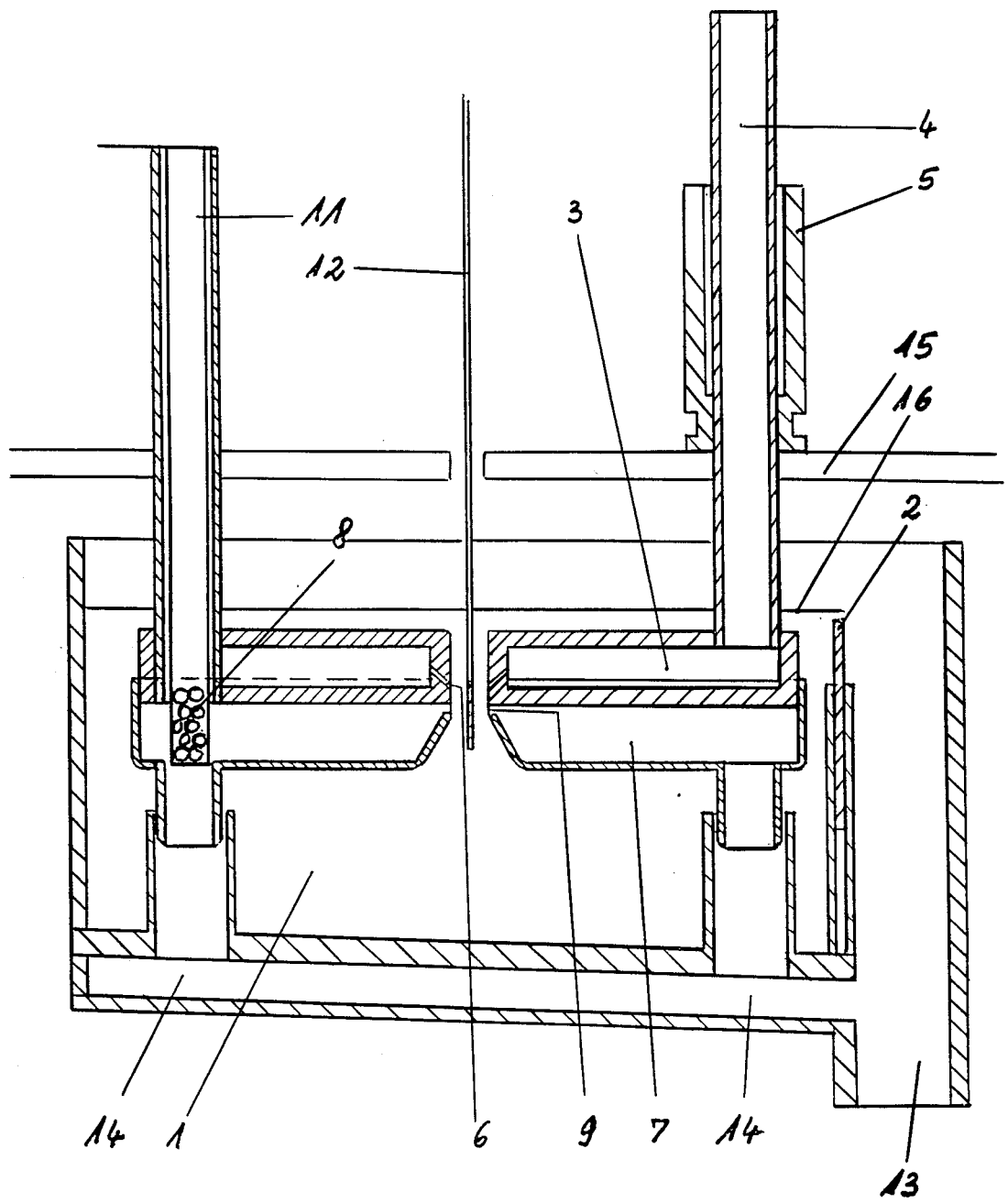
FIG. 1c is a section otherwise the same as with the previous drawing, the left side including a section plane through the niche-shaped construction for the anodes and the right side being sectioned through the electrolyte introduction means.
Figure 2:
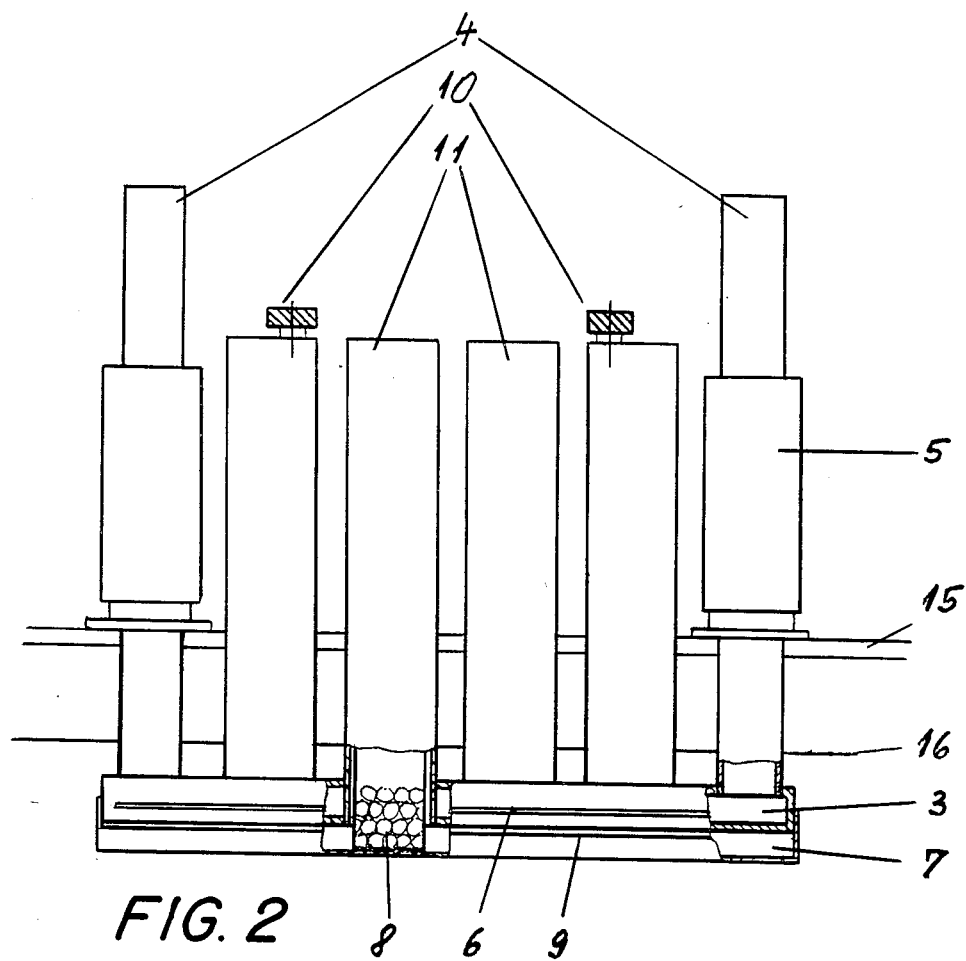
FIG. 2 is a front view representation of the nozzles of the electrolysis arrangement according to the present invention.
Figure 3:
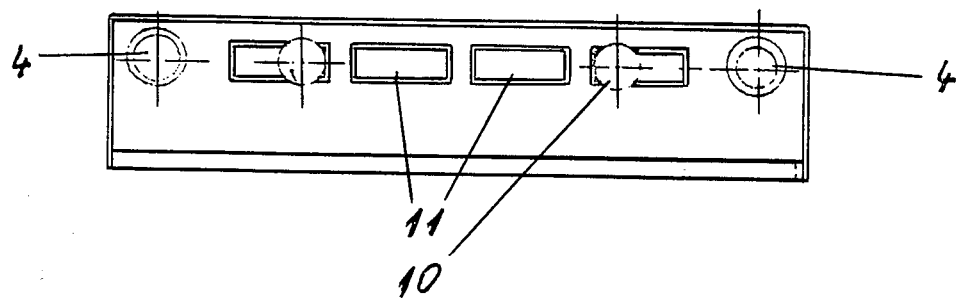
FIG. 3 represents a plan view taken from FIG. 2.
Figure 4:
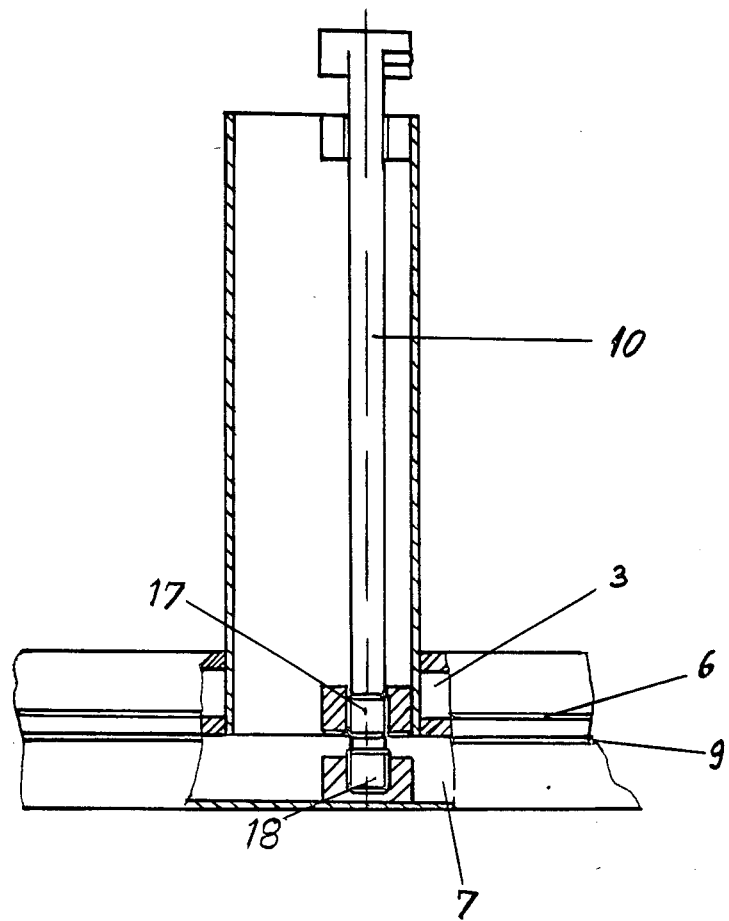
FIG. 4 is a schematic representation of a spindle for the adjustment of the slit width of the lower chamber.

It is preferable for the arrangement according to the present invention that:

The lower chamber be provided with a niche-shaped construction through which the applied insulated anodes are projected into the chamber;

The nozzles should be disposed so as to be vertically adjustable;

An adjustable opening displayed by the lower chamber have a cross-section substantially between about 300 and 2500 mm$^2$;

The exit openings for the nozzles should be located close to the work piece;

The work piece should be arranged at a relative interval of approximately 10 mm$^2$ from the nozzles;

The exit opening for the upper chamber is directed at an acute angle to the surface of the work piece;

The arrangement should be disposed both vertically and horizontally adjustable relative to the work piece; and Supplementary unit means be provided for transport of the work piece in a longitudinal direction through the electrolysis tank.

Regarding the method set forth in the claims, the invention also encompasses a continuous electrolytic deposition of work pieces, particularly so-called plug-and-socket type contacts of conductor plates (printed circuits) for which in particular the abovedescribed arrangements is designed.

The method of the invention includes electrolytic deposition of nickel- or gold-coatings at the plug-and-socket contacts of the printed circuits.

The electrolysis is generally performed with flow densities ranging between about 10 and 100 A/dm$^2$. Preferably, however, flow densities between 20 and 60 A/dm$^2$ are employed.

Flow velocities for the electrolyte vary within broad limits, i.e., between approximately 0.1 and 100.0 m/S. Preferably, these values range from about 1.0 up to 3 m/S.

A further consideration in electrolysis techniques is the pressure at which the electrolyte comes in contact with the work piece. That is, it has proven to be advantageous according to the present invention for an excess pressure to be provided. Preferably this excess pressure runs from about 0.8 and 1.0 bar.

Both the arrangement and the method according to the present invention enable a deposition of pore-free precipitant with uniform layer-thickness and at improved deposition velocity, it further advantageously following therefrom that the thickness is thereby controllable.

It is an additional advantage according to the present invention that soluble anodes are employed. In this manner, the otherwise necessary replenishment of toxicologically unfavorable nickel carbonate is avoided. In addition, the present invention enables metallization of optionally-shaped work pieces. It goes without saying, however, that even insoluble anodes can similarly be employed according to the present invention.

The method and apparatus according to this invention are suitable in particular for the electrolysis of nickel and gold on to the plug-and-socket type contacts of printed circuits during a continuous operation.

Electrolyte compositions of all known types can be employed as the bath. Preferably though, it is e.g., conventional nickel- and gold-baths that are employed.

The nozzle means are composed of two chambers having separate entranceways, which project into the electrolysis vat filled up to the level of the adjustable overflow. The upper chamber is formed as an electrolyte nozzle with the outer electrolyte lead-ins and the there-located adjustment arrangement as well as the longitudinal nozzle slit inclined downwardly to the work piece. The lower chamber is formed by means of an opening of the anode apertured chamber, vertically adjustable width height and directed to the cathodically-layered work piece; it is into this opening that the applied insulated and soluble or insoluble anodes project. Both chambers have separate lead-in conduits, a feature of particular advantage when the strong electrolyte introduction is not effected directly to the anode space. Moreover, the anode projecting into the anode niche do not come into contact with the elctrolyte in the electrolyte nozzle.

The manner of operation of the arrangement is provided by an optimal adjustment of both chambers to the bren point of the surface to be galvanized of the work piece. Expediently, this purpose is achieved by adjustment of the ideal height of the nozzles at the adjustment arrangement of the electrolyte inlet and the slit height of anode-apertured chamber by means of two spindles during the operation of the arrangement above the machine table by means of graduated adjustments.

With an employment of soluble anodes the possible silting up of the anode-apertured chamber can be avoided advantageously by leading the anode sediment steadily with the current through a neighboring run-off canal into the supply container. The neighboring run-off canal—in connection with the main run-off—is relatively small and this operation is promoted by the injector effect of the main run-off.

The selection of materials capable of being employed in the work piece is not limited by the specifications of the method, or for that matter, apparatus according to the present invention. All customary materials can be employed to the extent that they are durable against the activity of the baths to be employed.

Control of the arrangement can be effected by means of electronic systems, whereby the arrangement itself can exist as a component of an automatically-operated plant embracing transportation arrangement means and control systems means.

In the drawings the following reference numerals are employed:
1. Electrolysis vat
2. Overflow
3. Upper chamber
4. Electrolyte lead-in
5. Adjustment arrangement
6. Nozzles slit
7. Lower Chamber
8. Anodes
9. Adjustable opening
10. Spindles for adjustment of the slit height of the lower chamber
11. Niche-shaped construction for the anodes.
12. Work piece
13. Main run-off
14. Neighboring run-off
15. Machine table
16. Bath window
17. Right worm
18. Left worm It will be understood that each of the elements described above, or two or more together, may also find a useful application in other types of electrolysis techniques, differing from the types described above.

While the invention has been illustrated and described as embodied in apparatus and method for the galvanic deposition of metals, it is not intended to be limited to the details shown, since various modifications and structural changes may be made without departing in any way from the spirit of the present invention.

Without further analysis, the foregoing will also fully reveal the gist of the present invention, that others can, by applying current knowledge, readily adapt it for various applications without omitting features, that from the standpoint of prior art, fairly constitute essential characteristics of the generic or specific aspects of this invention.

What is claimed as new and desired to be protected by Letters Patent is set forth in the appended claims:

1. Arrangement for the galvanic deposition of metal, of the type having an electrolysis tub with overflow, electrodes, nozzles, connecting conduit tubes, pumps, control system and dosaging system as well as electrical appurtenances, wherein a cathodically-connected and to be galvanized work piece is disposed between two nozzles, each said nozzle being formed from two chambers located one above the other and with separate outlets and entrances,
    an upper of said chambers contains an electrolyte exit-opening in the form of a slit, and
    a lower of said chambers comprises a shaft-shaped construction for the purpose of projecting thereinto the chamber applied insulated anodes, and is provided with an anode niche, said anode niche defining at the height of said slit a vertically-adjusted opening having a cross-section from 300 to 2500 mm$^2$.

2. Arrangement according to claim 1, wherein said nozzles are disposed vertically adjustable.

3. Arrangement according to claim 1, wherein the exit openings of said nozzles are located close to work piece.

4. Arrangement according to claim 1, defining between said work piece and said nozzles a distance of about 10 mm.

5. Arrangement according to claim 1, said exit openof said upper chamber is directed at an acute angle to a surface of said work piece.

6. Arrangement according to claim 1, further comprising means for transporting said work piece in a longitudinal direction through said electrolysis tank.

7. Arrangement for the galvanic deposition of plug contacts of conductor plates, of the type having an electrolysis tub with overflow, electrodes, nozzles, connecting conduit tubes, pumps, control system and dosaging system as well as electrical appurtenances, wherein a cathodically-connected and to be galvanized work piece is disposed between two nozzles, each said nozzle being formed from two chambers located one above the other and with separate outlets and entrances, an upper of said chambers contains an electrolyte exit-opening in the form of a slit, and a lower of said chambers comprises a shaft-shaped construction for the purpose of projecting thereinto the chamber applied insulated anodes, and is provided with an anode niche, said anode niche defining at the height of said slit a vertically-adjusted opening having a cross-section from 300 to 2500 mm$^2$.

8. Arrangement according to claim 7, wherein a current density from about 20 to 60 A/dm$^2$ is employed.

9. Arrangement according to claim 7, wherein an electrolyte flow velocity is from about 1 to 3 m/S.

10. Arrangement according to claim 7, wherein an electrolyte is introduced at an excess pressure from 0.8 to 1.0 bar.

11. Arrangement for the galvanic deposition of nickel- or gold-coatings onto plug contacts of conductor plates, of the type having an electrolysis tub with overflow, electrodes, nozzles, connecting conduit tubes, pumps, control system and dosaging system as well as electrical appurtenances, wherein a cathodically-connected and to be galvanized work piece is disposed between two nozzles, each said nozzle being formed from two chambers located one above the other and with separate outlets and entrances, an upper of said chambers contains an electrolyte exit-opening in the form of a slit, and a lower of said chambers comprises a shaft-shaped construction for the purpose of projecting thereinto the chamber applied insulated anodes, and is provided with an anode niche, said anode niche defining at the height of said slit a vertically-adjusted opening having a cross-section from 300 to 2500 mm$^2$.

* * * * *